United States Patent
Phillips

(10) Patent No.: US 12,525,749 B2
(45) Date of Patent: Jan. 13, 2026

(54) RECEPTACLE CAGE FOR A RECEPTACLE CONNECTOR ASSEMBLY OF A COMMUNICATION SYSTEM

(71) Applicant: TE Connectivity Solutions GmbH, Schaffhausen (CH)

(72) Inventor: Michael John Phillips, Camp Hill, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 300 days.

(21) Appl. No.: 18/342,795

(22) Filed: Jun. 28, 2023

(65) Prior Publication Data

US 2024/0055809 A1    Feb. 15, 2024

Related U.S. Application Data

(60) Provisional application No. 63/397,433, filed on Aug. 12, 2022.

(51) Int. Cl.
*H01R 13/6582* (2011.01)
*G02B 6/42* (2006.01)
*H01R 13/502* (2006.01)

(52) U.S. Cl.
CPC ......... *H01R 13/6582* (2013.01); *G02B 6/428* (2013.01); *H01R 13/502* (2013.01); *G02B 6/4277* (2013.01)

(58) Field of Classification Search
CPC .. H01R 13/6582; H01R 13/502; G02B 6/428; G02B 6/4277; G02B 6/4269; H05K 9/0058
See application file for complete search history.

(56) References Cited

U.S. PATENT DOCUMENTS

| | | | | |
|---|---|---|---|---|
| 7,001,217 | B2 * | 2/2006 | Bright | H05K 7/20418 439/607.2 |
| 10,923,856 | B2 | 2/2021 | Sharf et al. | |
| 11,888,269 | B2 * | 1/2024 | Sharf | H01R 13/6587 |
| 2014/0196943 | A1 * | 7/2014 | Hirschy | G02B 6/4246 174/382 |
| 2020/0015385 | A1 * | 1/2020 | Bucher | H05K 5/0286 |
| 2021/0013679 | A1 * | 1/2021 | Chen | H01R 13/6581 |
| 2021/0083435 | A1 * | 3/2021 | Kumar | H01R 13/6581 |
| 2021/0359470 | A1 * | 11/2021 | Dunwoody | H01R 13/5219 |
| 2023/0344173 | A1 * | 10/2023 | Briant | H01R 13/64 |
| 2024/0055809 | A1 * | 2/2024 | Phillips | H05K 9/0058 |
| 2025/0158304 | A1 * | 5/2025 | Dunbar | H01R 12/73 |

* cited by examiner

*Primary Examiner* — Abdullah A Riyami
*Assistant Examiner* — Nader J Alhawamdeh

(57) ABSTRACT

A receptacle cage includes shielding walls forming a module channel configured to receive a pluggable module. The shielding walls include a top wall, a first side wall extending from the top wall to a bottom of the module channel, and a second side wall extending from the top wall opposite the first side wall to the bottom of the module channel. The top wall, the first side wall and the second side wall form the module channel. The receptacle cage includes a first polarization tab extending into the module channel from the first side wall. The first polarization tab is configured to interface with the pluggable module for keyed loading of the pluggable module in the receptacle cage.

20 Claims, 4 Drawing Sheets

RECEPTACLE CAGE FOR A RECEPTACLE CONNECTOR ASSEMBLY OF A COMMUNICATION SYSTEM

CROSS REFERENCE TO RELATED APPLICATIONS

This application claims benefit to U.S. Provisional Application No. 63/397,433, filed 12 Aug. 2022, titled "RECEPTACLE CAGE FOR A RECEPTACLE CONNECTOR ASSEMBLY OF A COMMUNICATION SYSTEM", the subject matter of which is herein incorporated by reference in its entirety.

BACKGROUND OF THE INVENTION

The subject matter herein relates generally to communication systems.

Some communication systems utilize communication connectors to interconnect various components of the system for data communication. Some known communication systems use pluggable modules, such as I/O modules, that are electrically connected to the communication connector. Known communication systems provide electrical shielding, such as in the form of a receptacle cage surrounding the communication connector and the pluggable module to provide electrical shielding. Some pluggable modules and corresponding receptacle cages have been developed having a polarization feature in the form of a tab extending from the top wall of the receptacle cage into the channel to interface with features in the pluggable module for keyed mating of the pluggable module in the receptacle cage. The polarization feature restricts loading of incorrect pluggable modules into the receptacle cage. Some receptacle cages have been developed including locating features in the form of tabs extending from the bottom wall of the receptacle cage into the channel to interface with the pluggable module to vertically position the pluggable module in the channel.

The polarization features and the locating features are susceptible to bending when side loaded by the pluggable module. The bending of the polarization features improperly positions the polarization features in the channel leading to improper keying or lack of keying. The bending of the locating features improperly positions the locating features in the channel leading to improper positioning of the pluggable module in the channel. Additionally, the distal ends of the feature may damage the pluggable module, such as scraping or scratching against the pluggable module during loading of the pluggable module into the channel.

A need remains for a receptacle cage having improved features for controlled loading of a pluggable module into the channel of the receptacle cage.

BRIEF DESCRIPTION OF THE INVENTION

In one embodiment, a receptacle cage is provided and includes shielding walls forming a module channel configured to receive a pluggable module. The shielding walls include a top wall, a first side wall extending from the top wall to a bottom of the module channel, and a second side wall extending from the top wall opposite the first side wall to the bottom of the module channel. The top wall, the first side wall and the second side wall form the module channel. The receptacle cage includes a first polarization tab extending into the module channel from the first side wall. The first polarization tab is configured to interface with the pluggable module for keyed loading of the pluggable module in the receptacle cage.

In another embodiment, a receptacle connector assembly is provided and includes a receptacle connector configured to be mounted to a host circuit board. The receptacle connector includes a connector housing having a mating end configured to be mated with a pluggable module. The receptacle connector includes receptacle contacts held by the connector housing. The receptacle contacts are configured to be coupled to the host circuit board. The receptacle contacts are configured to be mated with the pluggable module. The receptacle connector assembly includes a receptacle cage having shielding walls forming a cavity that receives the receptacle connector. The shielding walls form a module channel within the cavity forward of the receptacle connector configured to receive the pluggable module. The shielding walls include a top wall, a first side wall extending from the top wall to a bottom of the receptacle cage, and a second side wall extending from the top wall opposite the first side wall to the bottom of the receptacle cage. The receptacle cage include a first polarization tab extending into the module channel from the first side wall. The first polarization tab is configured to interface with the pluggable module for keyed loading of the pluggable module in the receptacle cage.

In a further embodiment, a communication system is provided and includes a pluggable module having a pluggable body extending between a mating end and a cable end. The pluggable module includes a module circuit board held in the pluggable body at the mating end. The module circuit board has a mating edge. The communication system includes a receptacle connector assembly configured to be mounted to a host circuit board. The receptacle connector assembly includes a receptacle connector configured to be mounted to a host circuit board and a receptacle cage surrounding the receptacle connector. The receptacle connector includes a connector housing having a card slot at a mating end. The card slot receives the edge of the module circuit board. The receptacle connector includes receptacle contacts held by the connector housing configured to be mated to the module circuit board when plugged into the card slot. The receptacle contacts are configured to be coupled to the host circuit board. The receptacle cage includes shielding walls forming a cavity that receives the receptacle connector. The shielding walls form a module channel within the cavity forward of the receptacle connector that receives the pluggable module. The shielding walls include a top wall, a first side wall extending from the top wall to a bottom of the receptacle cage, and a second side wall extending from the top wall opposite the first side wall to the bottom of the receptacle cage. The receptacle cage include a first polarization tab extending into the module channel from the first side wall. The first polarization tab configured to interface with the pluggable module when plugged into the module channel for keyed loading of the pluggable module in the receptacle cage.

DETAILED DESCRIPTION OF THE INVENTION

Figure 1:
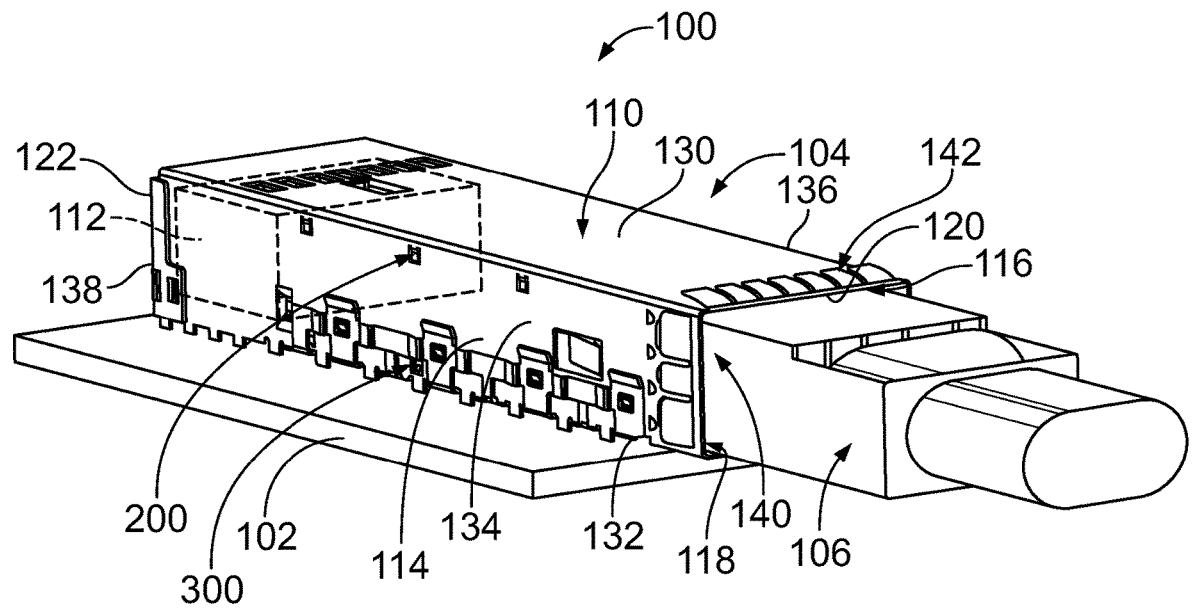
FIG. 1 is a front perspective view of a communication system formed in accordance with an exemplary embodiment.
Figure 2:
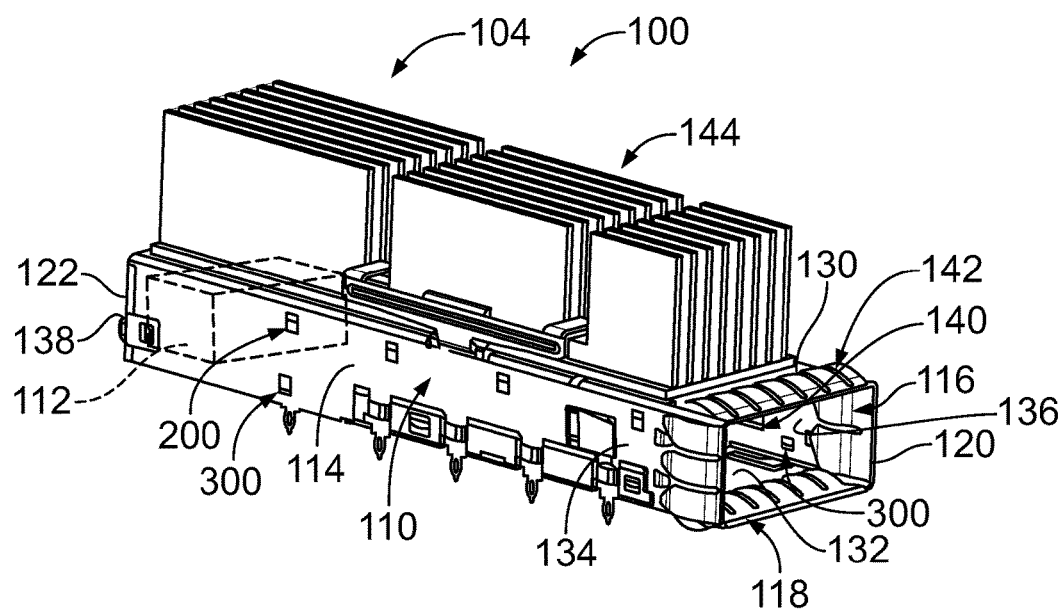
FIG. 2 is a front perspective view of the communication system formed in accordance with an exemplary embodiment showing a heat sink.

FIG. 1 is a front perspective view of a communication system 100 formed in accordance with an exemplary embodiment. FIG. 2 is a front perspective view of the communication system 100 formed in accordance with an exemplary embodiment showing a heat sink 144. The communication system 100 includes a host circuit board 102 and a receptacle connector assembly 104 mounted to the host circuit board 102. A pluggable module 106 (examples shown in FIGS. 3 and 4) is configured to be electrically connected to the receptacle connector assembly 104. The pluggable module 106 is electrically connected to the host circuit board 102 through the receptacle connector assembly 104.

In an exemplary embodiment, the receptacle connector assembly 104 and the pluggable module 106 has keyed mating to ensure that the pluggable module 106 is mated with a correct receptacle connector assembly 104. Variations in the keyed mating may allow mating of different types of pluggable modules 106 within the communication system 100. Different types of receptacle connector assemblies 104, having different polarization features, may be provided within the communication system 100 to receive the different types of pluggable modules 106 having different shapes/sizes or different polarization features. Different receptacle connector assemblies 104 may have different characteristics (for example, different mating interfaces, different types of connectors, different sizes, different heat transfer elements, and the like) and the different pluggable modules 106 may have different characteristics (for example, different mating interfaces, different types of connectors, different sizes, different heat transfer elements, and the like).

In an exemplary embodiment, the receptacle connector assembly 104 includes a receptacle cage 110 and a communication connector 112 adjacent the receptacle cage 110. The communication connector 112 may be received in the receptacle cage 110. In other various embodiments, the communication connector 112 may be located rearward of the receptacle cage 110. In various embodiments, the receptacle cage 110 is enclosed and provides electrical shielding for the communication connector 112. The pluggable modules 106 are loaded into the receptacle cage 110 and are at least partially surrounded by the receptacle cage 110. In an exemplary embodiment, the receptacle cage 110 is a shielding, stamped and formed cage member that includes a plurality of shielding walls 114 that define one or more module channels for receipt of corresponding pluggable modules 106. In other embodiments, the receptacle cage 110 may be open between frame members to provide cooling airflow for the pluggable modules 106 with the frame members of the receptacle cage 110 defining guide tracks for guiding loading of the pluggable modules 106 into the receptacle cage 110.

In the illustrated embodiment, the receptacle cage 110 is a single port receptacle cage configured to receive a single pluggable module 106. In other various embodiments, the receptacle cage 110 may be a ganged cage member having a plurality of ports ganged together in a single row and/or a stacked cage member having multiple ports stacked as an upper port and a lower port.

The receptacle cage 110 includes a module channel 116 having a module port 118 open to the module channel 116. The module channel 116 receives the pluggable module 106 through the module port 118. In an exemplary embodiment, the receptacle cage 110 extends between a front end 120 and a rear end 122. The module port 118 is provided at the front end 120.

In an exemplary embodiment, the receptacle cage 110 includes one or more cage polarization features 200 (for example, tabs, posts or other protrusions extending into the module channel 116) for keyed mating with the pluggable module 106. In an exemplary embodiment, the receptacle cage 110 includes one or more cage locating features 300 (for example, tabs, posts or other protrusions extending into the module channel 116) used to locate the pluggable module 106 in the module channel 116.

Any number of module channels 116 may be provided in various embodiments arranged in a single column or in multiple columns (for example, 2×2, 3×2, 4×2, 4×3, 4×1, 2×1, and the like). Optionally, multiple communication connectors 112 may be arranged within the receptacle cage 110, such as when multiple rows and/or columns of module channels 116 are provided.

In an exemplary embodiment, the shielding walls 114 of the receptacle cage 110 include a first end wall 130, a second end wall 132, a first side wall 134, and a second side wall 136. The side walls 134, 136 extend between the end walls 130, 132. In various embodiments, the first end wall 130 is at a top of the receptacle cage 110, and thus defines a top wall 130, and the second end wall 132 is at a bottom of the receptacle cage 110, and thus defines a bottom wall 132. Other orientations are possible in alternative embodiments, such as the second end wall 132 or one of the side walls 134, 136 defining the top wall. The bottom wall 132 may face, and possibly resting on, the host circuit board 102. In various embodiments, the receptacle cage 110 may be provided without the bottom wall 132. Optionally, the walls 114 of the receptacle cage 110 may include a rear wall 138 at the rear end 122.

The walls 114 define a cavity 140. For example, the cavity 140 may be defined by the first end wall 130, the second end wall 132, the side walls 134, 136 and the rear wall 138. The cavity 140 includes the module channel 116. In various embodiments, the cavity 140 receives the communication connector 112, such as at the rear end 122. Other walls 114 may separate or divide the cavity 140 into additional module channels 116, such as in embodiments using ganged and/or stacked receptacle cages. For example, the walls 114 may include one or more vertical divider walls between ganged module channels 116. In various embodiments, the walls 114 may include a separator panel between stacked upper and lower module channels 116. The separator panel may include an upper panel and a lower panel that form a space between the upper and lower module channels 116, such as for airflow, for a heat sink, for routing light pipes, or for other purposes.

In an exemplary embodiment, the receptacle cage 110 may include one or more gaskets 142 at the front end 120 for providing electrical shielding for the module channels 116. For example, the gaskets 142 may be provided at the port 118 to electrically connect with the pluggable modules 106 received in the module channel 116. In an exemplary embodiment, the gaskets 142 may be provided around the exterior of the receptacle cage 110 for interfacing with a panel (not shown), such as when the front end 120 of the receptacle cage 110 extends through a cutout in the panel. The gaskets 142 may include spring fingers or other deflectable features that are configured to be spring biased against the panel to create an electrical connection with the panel and/or to interface with the pluggable module 106 to create an electrical connection with the pluggable module.

Optionally, the receptacle connector assembly 104 may include one or more heat sinks 144 (FIG. 2) for dissipating heat from the pluggable modules 106. For example, the heat sink 144 may be coupled to the top wall 130 for engaging the pluggable module 106 received in the module channel 116. The heat sink 144 may extend through an opening in the top wall 130 to directly engage the pluggable module 106. Other types of heat sinks may be provided in alternative embodiments.

In an exemplary embodiment, the pluggable modules 106 are loaded through the port 118 at the front end 120 to mate with the communication connector 112. The shielding walls 114 of the receptacle cage 110 provide electrical shielding around the communication connector 112 and the pluggable module 106, such as around the mating interface between the communication connector 112 and the pluggable module 106.

Figure 3:
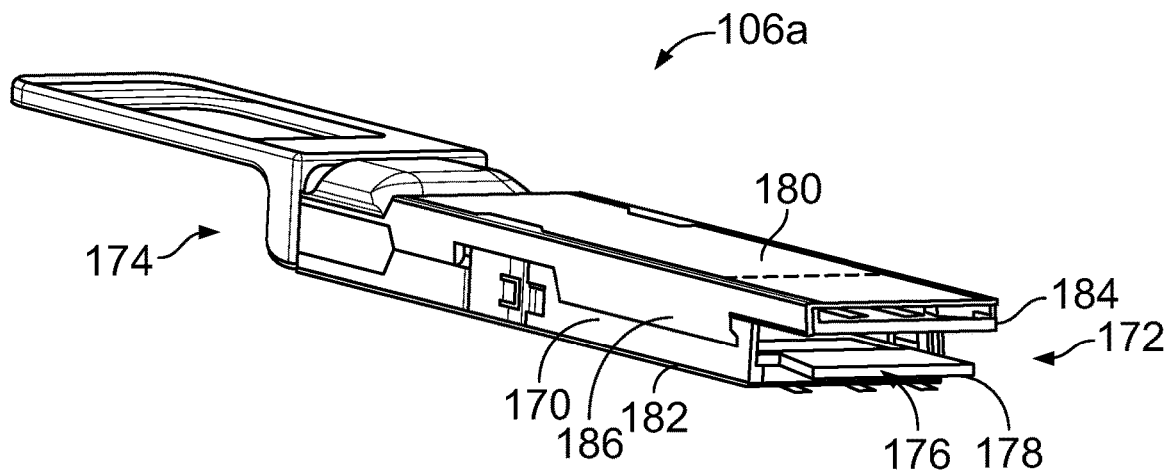
FIG. 3 is a perspective view of the pluggable module in accordance with an exemplary embodiment.
Figure 4:
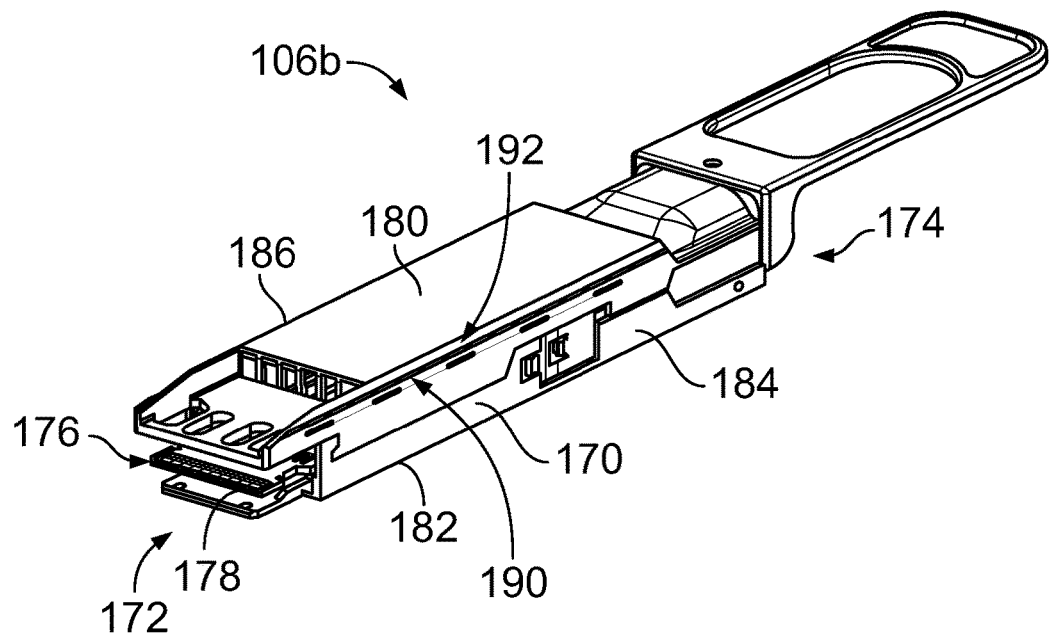
FIG. 4 is a perspective view of the pluggable module in accordance with an exemplary embodiment.

FIG. 3 is a perspective view of the pluggable module 106 in accordance with an exemplary embodiment. FIG. 4 is a perspective view of the pluggable module 106 in accordance with an exemplary embodiment. FIG. 3 illustrates a "short" pluggable module 106a (compared to the tall pluggable module) and FIG. 4 illustrates a "tall" pluggable module 106b (compared to the short pluggable module). Both the short and the tall pluggable modules 106a, 106b may be loaded into the receptacle cage 110 (shown in FIGS. 1 and 2) and interface with the polarization features 200. However, other types of pluggable modules may be restricted from loading into the receptacle cage 110 by the polarization features 200.

The pluggable module 106 has a pluggable body 170, which may be defined by one or more shells. The pluggable body 170 may be thermally conductive and/or may be electrically conductive, such as to provide EMI shielding for the pluggable module 106. The pluggable body 170 includes a mating end 172 and an opposite front end 174. The mating end 172 is configured to be inserted into the corresponding module channel 116 (shown in FIG. 1). The front end 174 may be a cable end 174 having a cable extending therefrom to another component within the system.

The pluggable module 106 includes a connector interface, such as a module circuit board 176, which is configured to be communicatively coupled to the communication connector 112 (shown in FIG. 1). The module circuit board 176 may be accessible at the mating end 172. The module circuit board 176 has a mating edge 178 and mating contacts at the mating edge 178 configured to be mated with the communication connector 112. The module circuit board 176 may include components, circuits and the like used for operating and/or using the pluggable module 106. For example, the module circuit board may have conductors, traces, pads, electronics, sensors, controllers, switches, inputs, outputs, and the like associated with the module circuit board 176, which may be mounted to the module circuit board 176, to form various circuits. In various embodiments, the pluggable module 106 may be a fiber optic module. The connector interface(s) may include fiber optic cables and/or optical generators to transmit optical signals.

The pluggable module 106 includes an outer perimeter defining an exterior of the pluggable body 170. For example, the outer perimeter may be defined by a top 180, a bottom 182, a first side 184 and a second side 186. The short and tall pluggable modules (FIGS. 3 and 4) have different heights between the top 180 and the bottom 182. The pluggable body 170 may have other shapes in alternative embodiments.

In an exemplary embodiment, the tall pluggable module 106b (FIG. 4) includes one or more module polarization features 190 at the outer perimeter. For example, the module polarization feature 190 may be provided at the top 180 and/or along the sides 184, 186. The module polarization features 190 interface with the cage polarization features 200 of the receptacle cage 110. In various embodiments, the module polarization features 190 may be cutouts or slots 192 formed in the exterior of the pluggable body 170. The module polarization feature 190 is used to restrict mating of the pluggable module 106 in an incorrect orientation or with an incorrect receptacle cage 110. In various embodiments, non-polarized pluggable modules may be provided without the module polarization features 190 (for example, the cutouts or slots may be filled in) and such non-polarized pluggable modules are unable to be plugged into the receptacle cage because the cage polarization features 200 restrict loading of such non-polarized pluggable modules into the module channel 116.

In an exemplary embodiment, the short pluggable module 106a (FIG. 3) does not include any module polarization features 190. Rather the short pluggable module 106a is able to fit below the cage polarization features 200 and is thus able to plug into the module channel 116 of the receptacle cage 110. In alternative embodiments, the short pluggable module 106a may include module polarization features 190 similar to the module polarization features 190 of the tall pluggable module 106b (FIG. 4).

In an exemplary embodiment, the pluggable body 170 provides heat transfer for the module circuit board 176, such as for the electronic components on the module circuit board 176. For example, the module circuit board 176 is in thermal communication with the pluggable body 170 and the pluggable body 170 transfers heat from the module circuit board 176. Optionally, the pluggable body 170 may include a plurality of heat transfer fins (not shown) along at least a portion of the outer perimeter of the pluggable module 106, such as along the top, for dissipating heat from the pluggable body 170. A plate may connect the distal ends of the heat transfer fins to form a planar, flat surface, such as for interfacing with a heat sink.

Figure 5:
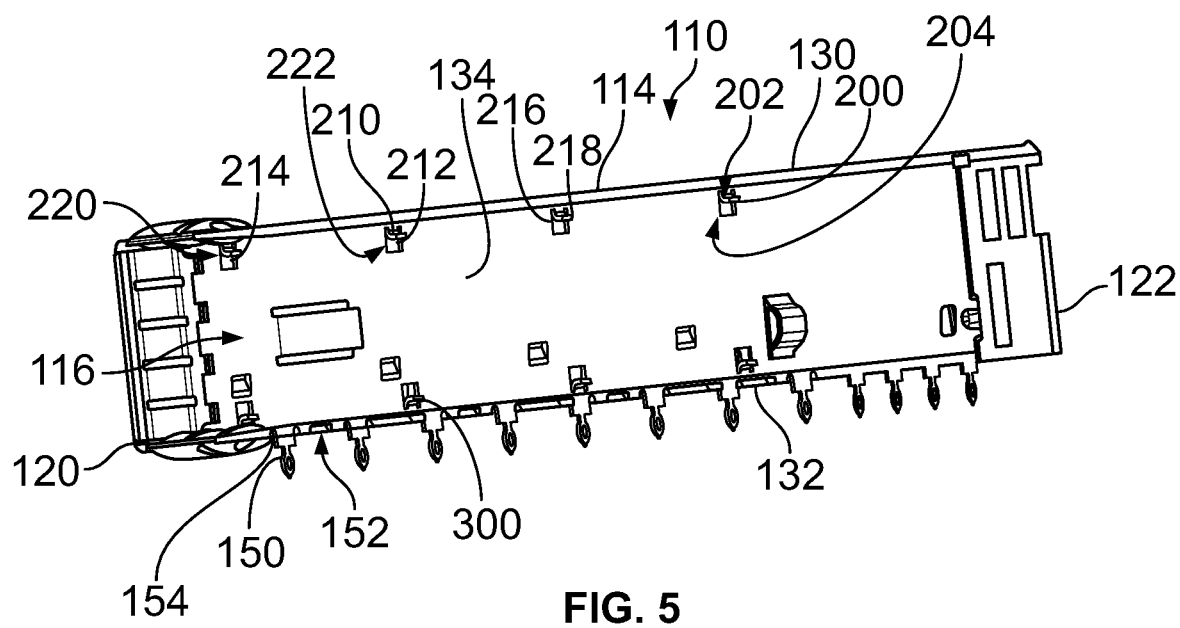
FIG. 5 is a partial sectional view of the receptacle cage in accordance with an exemplary embodiment.
Figure 6:
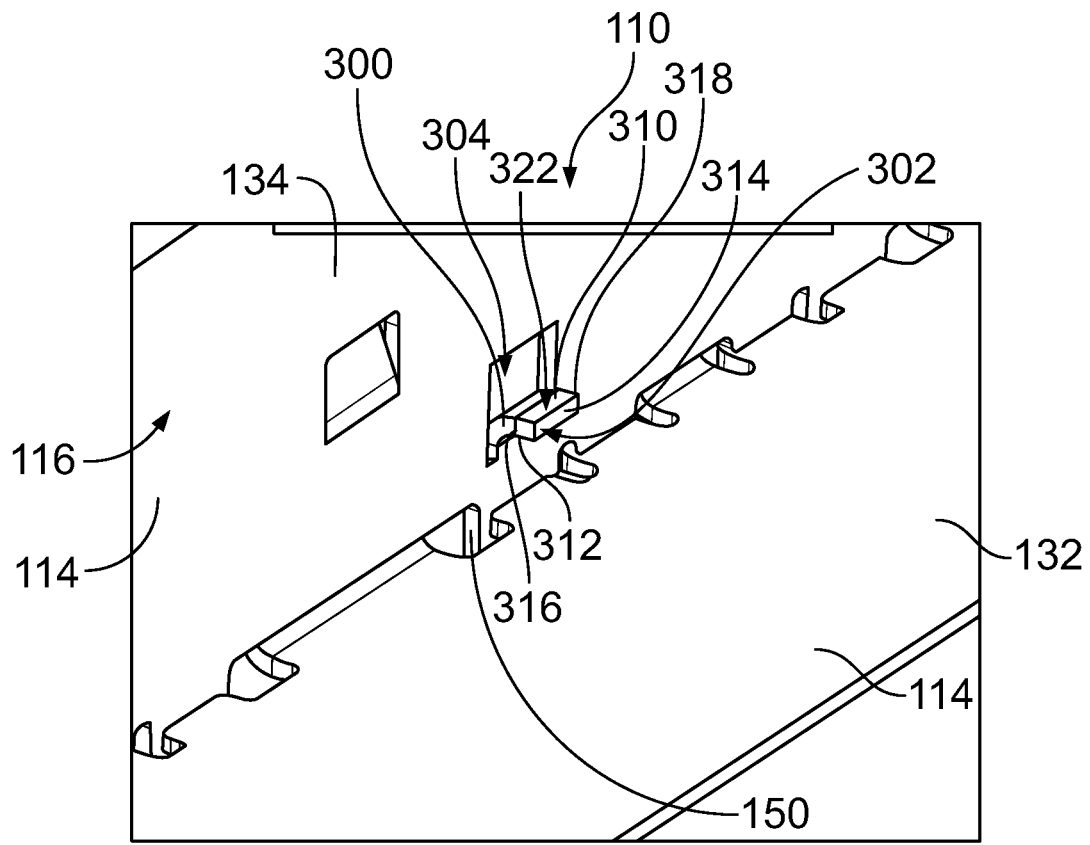
FIG. 6 is a perspective view of a portion of the receptacle cage in accordance with an exemplary embodiment.

FIG. 5 is a partial sectional view of the receptacle cage 110 in accordance with an exemplary embodiment. FIG. 6 is a perspective view of a portion of the receptacle cage 110. FIG. 5 shows the cage polarization features 200 and the cage locating features 300. FIG. 6 shows one of the cage locating features 300.

The receptacle cage 110 extends between the front end 120 and the rear end 122. The receptacle cage 110 includes the shielding walls 114 that define the module channel(s) 116. In an exemplary embodiment, the shielding walls 114 include the top wall 130, the bottom wall 132, and the side walls 134, 136 (only the first side wall 134 is shown in FIGS. 5 and 6). In an exemplary embodiment, the cage polarization features 200 and the cage locating features 300 are stamped and formed from the side walls 134, 136. The cage polarization features 200 and the cage locating features 300 extend into the module channel 116 to interface with the pluggable module 106.

In an exemplary embodiment, the receptacle cage 110 includes mounting tabs 150 at a bottom 152 of the receptacle cage 110. The mounting tabs 150 are used to mount the receptacle cage 110 to the host circuit board 102. In various embodiments, the mounting tabs 150 are compliant pins, such as eye-of-the-needle pins, configured to be press fit into plated vias of the host circuit board 102 to mechanically and electrically connect the receptacle cage 110 to the host circuit board 102. In various embodiments, the mounting tabs 150 include locating shoulders 154. The locating shoulders 154 are used to locate the mounting tabs 150 relative to the host circuit board 102. For example, the locating shoulders 154 control the loading depth of the mounting tabs 150 into the plated vias. The mounting tabs 150 are pressed downward until the locating shoulders 154 abut against the upper surface of the host circuit board 102.

The polarization features 200 include polarization tabs 202 extending into the module channel 116 from the first side wall 134 (and likewise from the second side wall 136). In an exemplary embodiment, each polarization tab 202 is stamped from an upper portion of the side wall 134 and formed (for example, bent) into the module channel 116. An opening 204 is formed in the side wall 134 when the polarization tab 202 is stamped from the side wall 134. In an exemplary embodiment, the polarization tab 202 is bent at a right angle, such as approximately 90°, relative to the side wall 134. In various embodiments, the polarization tab 202 is oriented parallel to the top wall 130. The polarization tab 202 is spaced apart from the top wall 130 by a distance. The distance may be altered to provide various keys for receiving different keyed pluggable modules 106. The distance may be small compared to the overall height of the side wall 134. For example, the polarization tab 202 may be located along an upper portion of the side wall 134, such as proximate to the top wall 130. In an exemplary embodiment, the polarization tab 202 may be located a predetermined distance from a particular feature of the receptacle cage 110, such as the mounting shoulders 154 of the mounting tabs 150 to position the polarization tab 202 relative to the upper surface of the host circuit board 102. Thus, the polarization tab 202 may be located relative to the mating interface of the communication connector 112.

In an exemplary embodiment, the polarization tab 202 includes a top surface 210, a bottom surface 212 and a distal edge 214. The polarization tab 202 includes a front edge 216 and a rear edge 218. The top surface 210 faces the top wall 130. The bottom surface 212 faces the bottom 152 of the receptacle cage 110, such as the bottom wall 132. The distal edge 214 faces the second side wall 136 across the module channel 116. The distal edge 214 may face a polarization tab (not shown) on the second side wall 136. The front edge 216 faces the front end 120 of the receptacle cage 110. The rear edge 218 faces the rear end 122 of the receptacle cage 110. The polarization tab 202 has a width between the front edge 216 and the rear edge 218. The width may be selected to provide a robust polarization tab 202 that is resistant to bending or damage by the pluggable module 106 when the pluggable module 106 is plugged into the module channel 116.

In an exemplary embodiment, the front edge 216 defines a blocking surface 220. The front edge 216 may block loading of certain pluggable modules 106 into the module channel 116, such as pluggable modules that do not include the module polarization features 190. For example, the pluggable module without the module polarization feature 190 may hit the front edge 216 of the polarization tab 202 when loaded into the module channel 116. The front edge 216 may thus stop such pluggable module from plugging into the module channel 116.

In an exemplary embodiment, the bottom surface 212 of the polarization tab 202 defines a bearing surface 222 facing the bottom 152. The bearing surface 222 is configured to engage the pluggable module 106 to locate the pluggable module 106 in the module channel 116. For example, the bearing surface 222 may engage the pluggable module 106 in the cutout 192 and vertically locate the pluggable module 106 in the module channel 116. The bearing surface 222 may prevent the pluggable module 106 from lifting upward in the module channel 116 and thus locates the module circuit board 176 at a predetermined location (for example, height) in the module channel 116 for mating with the communication connector 112.

In an exemplary embodiment, the distal edge 214 is spaced apart from the first side wall 134 by a predetermined distance. The spacing is defined by the length of the polarization tab 202. The distal edge 214 is configured to engage the pluggable module 106 to locate the pluggable module 106 in the module channel 116. The distal edge 214 prevents lateral (for example, side-to-side) movement of the pluggable module 106 in the module channel 116. For example, the distal edges 214 of the polarization tabs 202 on opposite side walls 134, 136 control the side-to-side positioning of the pluggable module 106 in the module channel 116. The distal edge 214 thus locates the module circuit board 176 at a predetermined lateral location (for example, side-to-side) in the module channel 116 for mating with the communication connector 112.

The locating features 300 include locating tabs 302 extending into the module channel 116 from the first side wall 134 (and likewise from the second side wall 136). The locating tabs 302 are used to locate the pluggable module 106 in the module channel 116. For example, the locating tabs 302 may be used to hold the pluggable module 106 at an elevated position, such as elevated above the host circuit board 102. The locating tabs 302 vertically position the pluggable module 106 in the module channel 116 at a position for mating with the communication connector 112. The locating tabs 302 may be used as keying or polarization features in various embodiments, such as for interfacing with complimentary keying or polarization features of the pluggable module 106 to allow or restrict plugging into the module channel 116.

In an exemplary embodiment, each locating tab 302 is stamped from a lower portion of the side wall 134 and formed (for example, bent) into the module channel 116. An opening 304 is formed in the side wall 134 when the locating tab 302 is stamped from the side wall 134. In an exemplary embodiment, the locating tab 302 is bent at a right angle, such as approximately 90°, relative to the side wall 134. In various embodiments, the locating tab 302 is oriented parallel to the bottom wall 132. The locating tab 302 is spaced apart from the bottom wall 132 by a distance 306. The distance 306 may be altered to control the vertical position of the pluggable module 106 in the module channel 116. The distance 306 may be small compared to the overall height of the side wall 134. For example, the locating tab 302 may be located along a lower portion of the side wall 134, such as proximate to the bottom wall 132. In an exemplary embodiment, the locating tab 302 may be located a predetermined distance from a particular feature of the receptacle cage 110, such as the mounting shoulders 154 of the mounting tabs 150 to position the locating tab 302 relative to the upper surface of the host circuit board 102. Thus, the locating tab 302 may be located relative to the mating interface of the communication connector 112.

In an exemplary embodiment, the locating tab 302 includes a top surface 310, a bottom surface 312 and a distal edge 314. The locating tab 302 includes a front edge 316 and a rear edge 318. The top surface 310 faces the top wall 130. The bottom surface 312 faces the bottom 152 of the receptacle cage 110, such as the bottom wall 132. The distal edge 314 faces the second side wall 136 across the module channel 116. The distal edge 314 may face a locating tab (not shown) on the second side wall 136. The front edge 316 faces the front end 120 of the receptacle cage 110. Optionally, the front edge 316 may be ramped to guide the pluggable module 106 to the top surface 310. The rear edge 318 faces the rear end 122 of the receptacle cage 110. The locating tab 302 has a width between the front edge 316 and the rear edge 318. The width may be selected to provide a robust locating tab 302 that is resistant to bending or damage by the pluggable module 106 when the pluggable module 106 is plugged into the module channel 116.

In an exemplary embodiment, the top surface 310 of the locating tab 302 defines a bearing surface 322. The bearing surface 322 is configured to engage the pluggable module 106 to locate the pluggable module 106 in the module channel 116. For example, the pluggable module 106 may ride along the top surface 310 and rest on the bearing surface 322. The bearing surface 322 vertically locates the pluggable module 106 in the module channel 116. The bearing surface 322 holds the pluggable module 106 at a predetermined location (for example, height) above the host circuit board 102 for mating with the communication connector 112.

In an exemplary embodiment, the distal edge 314 is spaced apart from the first side wall 134 by a predetermined distance. The spacing is defined by the length of the locating tab 302. The distal edge 314 may engage a portion of the pluggable module 106, such as the bottom portion of the pluggable module 106, to locate the pluggable module 106 in the module channel 116. The distal edge 314 may prevent lateral (for example, side-to-side) movement of the pluggable module 106 in the module channel 116. For example, the distal edges 314 of the locating tabs 302 on opposite side walls 134, 136 control the side-to-side positioning of the pluggable module 106 in the module channel 116.

Figure 7:
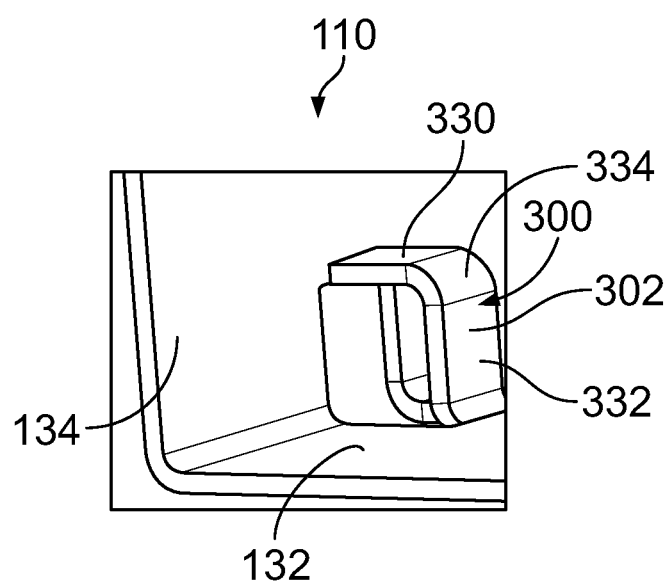
FIG. 7 is a perspective view of a portion of the receptacle cage showing one of the cage locating features in accordance with an exemplary embodiment.

FIG. 7 is a perspective view of a portion of the receptacle cage 110 showing one of the cage locating features 300 in accordance with an exemplary embodiment. In the illustrated embodiment, the cage locating feature 300 is box-shaped, rather than being a planar locating tab as shown in the embodiment of FIG. 6. In an exemplary embodiment, the locating tab 302 extends from the first side wall 134 and the bottom wall 132. The locating tab 302 is stamped from the first side wall 134 and the bottom wall 132. The locating tab 302 including a first support member 330 extending from the first side wall 134 and a second support member 332 extending from the bottom wall 132. The first support member 330 meets the second support member 332 at a corner 334. The box-shaped locating tab 302 is robust. The box-shaped locating tab 302 resists deflection in the downward direction and in the lateral direction due to being connected at two locations, such as both the first side wall 134 and the bottom wall 132.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A receptacle cage comprising:
shielding walls forming a module channel configured to receive a pluggable module, the shielding walls including a top wall, a first side wall extending from the top wall to a bottom of the module channel, and a second side wall extending from the top wall opposite the first side wall to the bottom of the module channel, wherein the top wall, the first side wall and the second side wall form the module channel;
a first polarization tab extending into the module channel from the first side wall, the first polarization tab configured to interface with the pluggable module for keyed loading of the pluggable module in the receptacle cage, the first polarization tab configured to restrict loading of non-keyed pluggable modules into the module channel.

2. The receptacle cage of claim 1, wherein the first polarization tab is spaced apart from the top wall.

3. The receptacle cage of claim 1, wherein the first polarization tab is oriented parallel to the top wall.

4. The receptacle cage of claim 1, wherein the first polarization tab includes a bearing surface facing the bottom, the bearing surface being configured to engage the pluggable module to locate the pluggable module in the module channel.

5. The receptacle cage of claim 1, wherein the first polarization tab includes a distal edge spaced apart from the first side wall, the distal edge being configured to engage the pluggable module to locate the pluggable module in the module channel and prevent lateral movement of the pluggable module in the module channel.

6. The receptacle cage of claim 1, wherein the first polarization tab is stamped from an upper portion of the first side wall and bent into the module channel from the first side wall, the first polarization tab having a forward facing front edge forming a blocking surface configured to restrict loading of the non-keyed pluggable modules into the module channel.

7. The receptacle cage of claim 1, further comprising a second polarization tab extending into the module channel from the second side wall, the second polarization tab configured to interface with the pluggable module for keyed loading of the pluggable module in the receptacle cage.

8. The receptacle cage of claim 1, further comprising a first locating tab extending into the module channel from the first side wall, the first locating tab configured to interface with the pluggable module to support the pluggable module within the module channel.

9. The receptacle cage of claim 8, wherein the first locating tab includes a bearing surface facing the top wall, the bearing surface being configured to engage the pluggable module to locate the pluggable module at an elevated position above the bottom of the module channel.

10. The receptacle cage of claim 8, wherein the first locating tab is located proximate to the bottom of the module channel.

11. The receptacle cage of claim 8, wherein the first locating tab is oriented parallel to the top wall.

12. The receptacle cage of claim 8, wherein the first locating tab is box shaped.

13. The receptacle cage of claim 8, wherein the shielding walls include a bottom wall at the bottom of the module channel extending between the first side wall and the second side wall, the first locating tab including a first support member extending from the first side wall and a second support member extending from the bottom wall, the first support member mating the second support member at a corner.

14. The receptacle cage of claim 8, further comprising a second locating tab extending into the module channel from the second side wall, the second locating tab configured to interface with the pluggable module to support the pluggable module in the module channel.

15. A receptacle connector assembly comprising:
a receptacle connector configured to be mounted to a host circuit board, the receptacle connector including a connector housing having a mating end configured to be mated with a pluggable module, the receptacle connector includes receptacle contacts held by the connector housing, the receptacle contacts configured to be coupled to the host circuit board, the receptacle contacts configured to be mated with the pluggable module; and
a receptacle cage having shielding walls forming a cavity that receives the receptacle connector, the shielding walls forming a module channel within the cavity forward of the receptacle connector configured to receive the pluggable module, the shielding walls including a top wall, a first side wall extending from the top wall to a bottom of the receptacle cage, and a second side wall extending from the top wall opposite the first side wall to the bottom of the receptacle cage, the receptacle cage including a first polarization tab extending into the module channel from the first side wall, the first polarization tab configured to interface with the pluggable module for keyed loading of the pluggable module in the receptacle cage, the first polarization tab configured to restrict loading of non-keyed pluggable modules into the module channel.

16. The receptacle connector assembly of claim 15, wherein the first polarization tab includes a bearing surface facing the bottom, the bearing surface being configured to engage the pluggable module to locate the pluggable module in the module channel.

17. The receptacle connector assembly of claim 15, wherein the first polarization tab includes a distal edge spaced apart from the first side wall, the distal edge being configured to engage the pluggable module to locate the pluggable module in the module channel and prevent lateral movement of the pluggable module in the module channel.

18. The receptacle connector assembly of claim 15, further comprising a first locating tab extending into the module channel from the first side wall, the first locating tab configured to interface with the pluggable module to support the pluggable module within the module channel.

19. The receptacle connector assembly of claim 18, wherein the first locating tab includes a bearing surface facing the top wall, the bearing surface being configured to engage the pluggable module to locate the pluggable module at an elevated position above the bottom of the module channel.

20. A communication system comprising:
a pluggable module having a pluggable body extending between a mating end and a cable end, the pluggable module including a module circuit board held in the pluggable body at the mating end, the module circuit board having a mating edge;
a receptacle connector assembly configured to be mounted to a host circuit board, the receptacle connector assembly including a receptacle connector configured to be mounted to a host circuit board and a receptacle cage surrounding the receptacle connector, the receptacle connector including a connector housing having a card slot at a mating end, the card slot receives the edge of the module circuit board, the receptacle connector includes receptacle contacts held by the connector housing configured to be mated to the module circuit board when plugged into the card slot, the receptacle contacts configured to be coupled to the host circuit board, the receptacle cage includes shielding walls forming a cavity that receives the receptacle connector, the shielding walls forming a module channel within the cavity forward of the receptacle connector that receives the pluggable module, the shielding walls including a top wall, a first side wall extending from the top wall to a bottom of the receptacle cage, and a second side wall extending from the top wall opposite the first side wall to the bottom of the receptacle cage, the receptacle cage including a first polarization tab extending into the module channel from the first side wall, the first polarization tab configured to interface with the pluggable module when plugged into the module channel for keyed loading of the pluggable module in the receptacle cage, the first polarization tab configured to restrict loading of non-keyed pluggable modules into the module channel.

* * * * *